(12) United States Patent
An et al.

(10) Patent No.: US 11,670,350 B2
(45) Date of Patent: Jun. 6, 2023

(54) DATA INPUT BUFFER AND SEMICONDUCTOR APPARATUS INCLUDING THE SAME

(71) Applicant: SK hynix Inc., Icheon-si (KR)

(72) Inventors: Soon Sung An, Icheon-si (KR); Kwan Su Shon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/473,240

(22) Filed: Sep. 13, 2021

(65) Prior Publication Data

US 2022/0335989 A1 Oct. 20, 2022

(30) Foreign Application Priority Data

Apr. 19, 2021 (KR) ........................ 10-2021-0050574

(51) Int. Cl.
*G11C 7/10* (2006.01)
*H03K 19/00* (2006.01)

(52) U.S. Cl.
CPC .......... *G11C 7/1048* (2013.01); *G11C 7/1057* (2013.01); *G11C 7/1084* (2013.01); *H03K 19/0005* (2013.01); *G11C 2207/2254* (2013.01)

(58) Field of Classification Search
None
See application file for complete search history.

(56) References Cited

U.S. PATENT DOCUMENTS

| 8,531,898 B2 | 9/2013 | Seol et al. |
| 2015/0371691 A1* | 12/2015 | Song ...................... G11C 29/12 |
| | | 365/189.05 |
| 2018/0158495 A1* | 6/2018 | Jeon ...................... G11C 29/028 |
| 2019/0259429 A1* | 8/2019 | Heo .......................... G11C 7/14 |
| 2021/0050041 A1* | 2/2021 | Durai ............... G11C 29/50008 |
| 2021/0103306 A1 | 4/2021 | Hwang et al. |

* cited by examiner

*Primary Examiner* — Anh Q Tran
(74) *Attorney, Agent, or Firm* — William Park & Associates Ltd.

(57) ABSTRACT

A data input buffer includes a plurality of buffer units configured to receive a first impedance calibration code and a second impedance calibration code, wherein each of the plurality of buffer units outputs an offset detected with a first input terminal and a second input terminal thereof short-circuited, as write data, and wherein a buffer unit corresponding to a current value of the first impedance calibration code among the plurality of buffer units is configured to correct the offset according to the second impedance calibration code.

20 Claims, 9 Drawing Sheets

DATA INPUT BUFFER AND SEMICONDUCTOR APPARATUS INCLUDING THE SAME

CROSS-REFERENCES TO RELATED APPLICATION

The present application claims priority under 35 U.S.C. § 119(a) to Korean application number 10-2021-0050574, filed on Apr. 19, 2021, in the Korean Intellectual Property Office, which is incorporated herein by reference in its entirety.

BACKGROUND

1. Technical Field

Various embodiments generally relate to a semiconductor circuit, and more particularly, to a data input buffer and a semiconductor apparatus including the same.

2. Related Art

A semiconductor apparatus includes a data input buffer for receiving data received from outside the semiconductor apparatus. The data input buffer identifies data bits as '0' or '1' by comparing inputted data and a reference voltage. However, an offset exists in an output signal of the data input buffer due to a variation in PVT (power, voltage and temperature), etc., which degrades the operational reliability of the data input buffer and eventually degrades the operational performance of the semiconductor apparatus including the data input buffer.

SUMMARY

Various embodiments are directed to a data input buffer capable of removing an offset of the data input buffer, and a semiconductor apparatus including the data input buffer.

In an embodiment, a data input buffer may include: a plurality of buffer units configured to receive a first impedance calibration code and a second impedance calibration code, wherein each of the plurality of buffer units outputs an offset detected with a first input terminal and a second input terminal thereof short-circuited, as write data, and wherein a buffer unit corresponding to a current value of the first impedance calibration code among the plurality of buffer units is configured to correct the offset according to the second impedance calibration code.

In an embodiment, a semiconductor apparatus may include: an impedance calibration circuit configured to perform an offset correction operation of calibrating a value of an impedance calibration code according to write data in response to an impedance calibration command and mode register setting information; and a data input buffer configured to detect an offset, output detected offset information as the write data, and correct the offset according to the impedance calibration code.

When the mode register setting information is set to a first logic level, the controller may control the impedance calibration circuit according to the impedance calibration command so that the impedance calibration circuit sequentially performs the offset correction operation and the impedance calibration operation. When the mode register setting information is set to a second logic level, the controller may control the impedance calibration circuit according to the impedance calibration command so that the impedance calibration circuit performs only the impedance calibration operation.

In an embodiment, a semiconductor apparatus may include: a data input buffer including a plurality of buffer units which receive a first impedance calibration code and a second impedance calibration code, wherein each of the plurality of buffer units outputs an offset detected with a first input terminal and a second input terminal thereof short-circuited, as write data, and wherein a buffer unit corresponding to a current value of the first impedance calibration code among the plurality of buffer units is configured to correct the offset according to the second impedance calibration code; a data output buffer configured to drive read data with an output impedance calibrated according to the first impedance calibration code and the second impedance calibration code to output the driven read data through a data input/output section; and an impedance calibration circuit configured to perform an impedance calibration operation of calibrating a value of at least one of the first impedance calibration code and the second impedance calibration code to calibrate an output impedance of the data output buffer based on an impedance of an external resistor in response to an impedance calibration command, and perform an offset correction operation of calibrating a value of at least one of the first impedance calibration code and the second impedance calibration code to correct an offset of the data input buffer according to the write data in response to mode register setting information and the impedance calibration command.

The impedance calibration circuit may be configured to sequentially perform, when the mode register setting information is set to a first logic level, the offset correction operation and the impedance calibration operation according to the impedance calibration command, and perform, when the mode register setting information is set to a second logic level, only the impedance calibration operation according to the impedance calibration command.

DETAILED DESCRIPTION

Hereinafter, various embodiments of a data input buffer and a semiconductor apparatus including the same will be described below with reference to the accompanying drawings.

Figure 1:
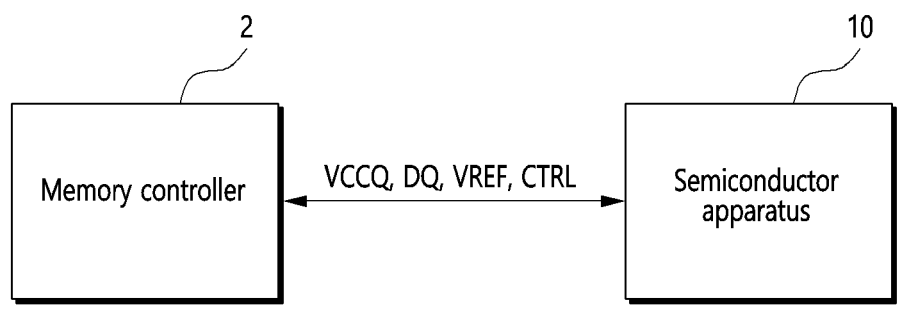
FIG. 1 is a diagram illustrating a configuration of a semiconductor system in accordance with an embodiment.

FIG. 1 is a diagram illustrating a configuration of a semiconductor system 1 in accordance with an embodiment.

Referring to FIG. 1, the semiconductor system 1 may include a memory controller 2 and a semiconductor apparatus 10.

The memory controller 2 may provide a power supply voltage, data DQ, a reference voltage VREF or/and a control signal CTRL to the semiconductor apparatus 10. The power supply voltage, as power for the operation of the semiconductor apparatus 10, will hereinafter be referred to as an external voltage VCCQ. The control signal CTRL may include a plurality of signals, that is, a command, an address, and various signals for controlling the data reception of the semiconductor apparatus 10. The various signals for controlling the data reception may have different values depending on an operation mode of the semiconductor apparatus 10. The various signals for controlling the data reception may have different values according to, for example, a low-speed mode, a high-speed mode, and so forth prescribed in the specification of the semiconductor apparatus 10, and will be described later. The memory controller 2 may receive data DQ from the semiconductor apparatus 10.

The semiconductor apparatus 10 may receive data DQ from the memory controller 2 and write the received data DQ to a memory region in the semiconductor apparatus 10 according to the control signal CTRL, or may read data DQ written to a memory region in the semiconductor apparatus 10 and provide the read data DQ to the memory controller 2 according to the control signal CTRL. The semiconductor apparatus 10 may detect and correct an offset of a data input buffer by using a code signal for the impedance calibration of a data output buffer, which will be described later.

Figure 2:
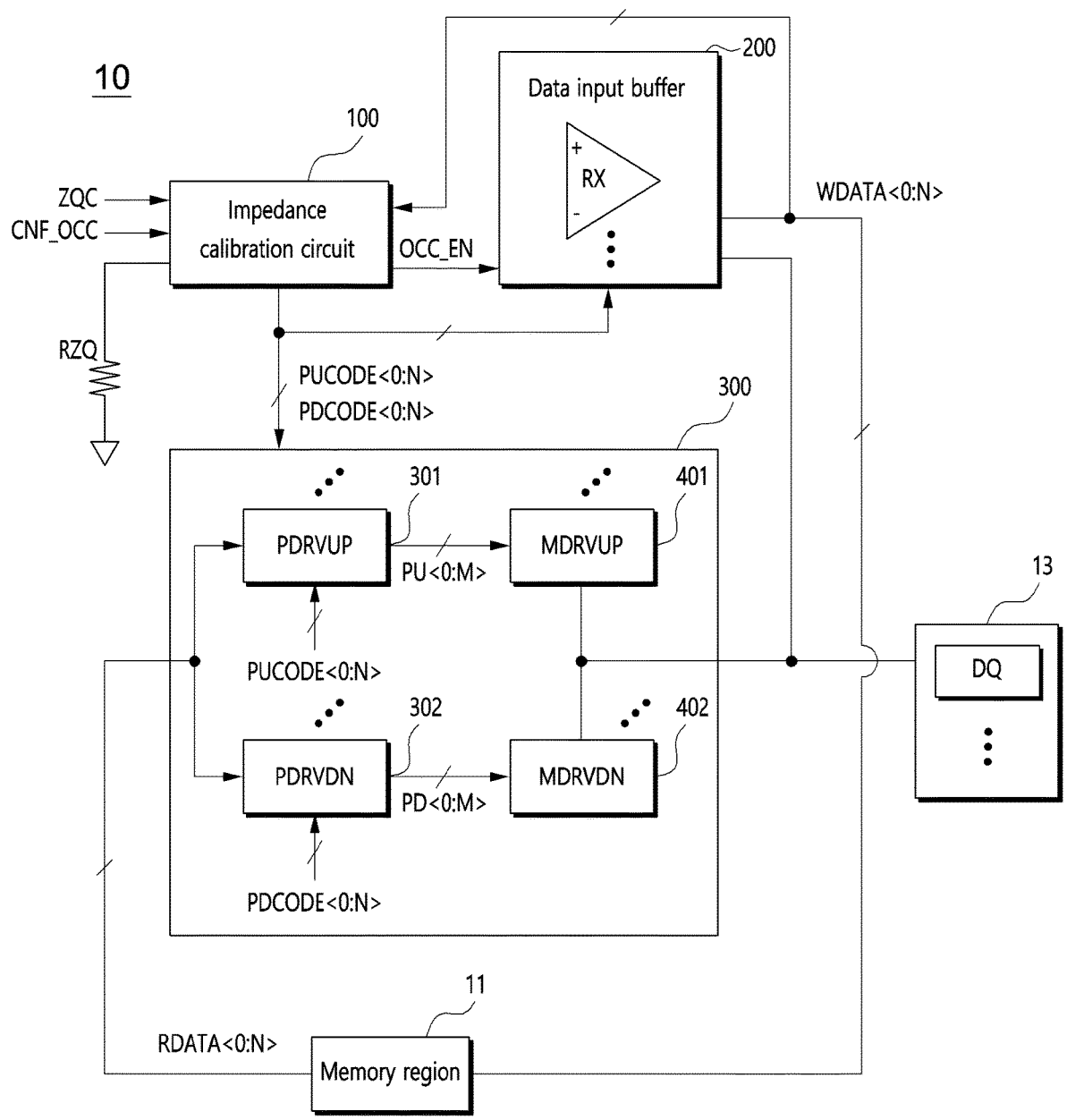
FIG. 2 is a diagram illustrating a configuration of a semiconductor apparatus in accordance with an embodiment.

FIG. 2 is a diagram illustrating a configuration of the semiconductor apparatus 10 in accordance with an embodiment.

Referring to FIG. 2, the semiconductor apparatus 10 may include a memory region 11, a data input/output section 13, an impedance calibration circuit 100, a data input buffer 200, and a data output buffer 300.

The memory region 11 may output read data RDATA<0:N> according to a read command and store write data WDATA<0:N>, inputted thereto, according to a write command. The memory region 11 may include at least one of volatile memory and nonvolatile memory. Examples of volatile memory may include SRAM (static RAM), DRAM (dynamic RAM), and SDRAM (synchronous DRAM). Examples of nonvolatile memory may include ROM (read only memory), PROM (programmable ROM), EEPROM (electrically erasable and programmable ROM), EPROM (electrically programmable ROM), flash memory, PRAM (phase change RAM), MRAM (magnetic RAM), RRAM (resistive RAM), and FRAM (ferroelectric RAM).

The data input/output section 13 may include a plurality of data input/output pads DQ. Data input/output between the semiconductor apparatus 10 and an external apparatus, for example, the memory controller 2, may be performed through the data input/output section 13.

The impedance calibration circuit 100 may perform an impedance calibration operation of calibrating a value of at least one of a first impedance calibration code PUCODE<0:N> and a second impedance calibration code PDCODE<0:N> based on an impedance of an external resistor RZQ in response to an impedance calibration command ZQC. The impedance calibration operation may be performed by calibrating a value of at least one of the first impedance calibration code PUCODE<0:N> and the second impedance calibration code PDCODE<0:N> so that an output impedance of the semiconductor apparatus 10 matches an impedance of the external resistor RZQ. The impedance calibration operation may be performed during a time period, for example, an initialization period, separate from a read operation period and a write operation period of the semiconductor apparatus 10.

The impedance calibration circuit 100 may perform an offset correction operation of calibrating a value of at least one of the first impedance calibration code PUCODE<0:N> and the second impedance calibration code PDCODE<0:N> according to the write data WDATA<0:N> in response to the impedance calibration command ZQC and mode register setting information CNF_OCC. The offset correction operation may be performed during a time period independent of the impedance calibration operation. The impedance calibration circuit 100 may generate an offset correction enable signal OCC_EN in response to the impedance calibration command ZQC and the mode register setting information CNF_OCC. The mode register setting information CNF_OCC may define whether to perform only the impedance calibration operation or sequentially perform the offset correction operation and the impedance calibration operation, according to the impedance calibration command ZQC. For example, when the mode register setting information CNF_OCC is set to a high level, the impedance calibration circuit 100 may sequentially perform the offset correction operation and the impedance calibration operation according to the impedance calibration command ZQC. When the mode register setting information CNF_OCC is set to a low level, the impedance calibration circuit 100 may perform only the impedance calibration operation according to the impedance calibration command ZQC.

The data input buffer 200 may generate the write data WDATA<0:N> by receiving data inputted through the data input/output section 13 during a write operation period of the semiconductor apparatus 10. The data input buffer 200 may detect an offset and output detected offset information as the write data WDATA<0:N>, in response to the offset correction enable signal OCC_EN. The data input buffer 200 may correct an offset according to the first impedance calibration code PUCODE<0:N> and the second impedance calibration code PDCODE<0:N>. The data input buffer 200 may include a plurality of buffer units RX corresponding to a plurality of data input/output pads DQ, respectively, of the data input/output section 13.

The output impedance of the data output buffer 300 may be changed according to the first impedance calibration code PUCODE<0:N> and the second impedance calibration code PDCODE<0:N>. The data output buffer 300 may drive the read data RDATA<0:N> with an output impedance determined according to the first impedance calibration code PUCODE<0:N> and the second impedance calibration code PDCODE<0:N>, and may output the driven read data RDATA<0:N> through the data input/output section 13. The data output buffer 300 may include a plurality of pre-pull-up drivers 301, a plurality of pre-pull-down drivers 302, a plurality of main pull-up drivers 401, and a plurality of main pull-down drivers 402. The plurality of pre-pull-up drivers 301 may generate a pull-up control signal PU<0:M> by driving the read data RDATA<0:N> according to the first impedance calibration code PUCODE<0:N>. The plurality of pre-pull-down drivers 302 may generate a pull-down control signal PD<0:M> by driving the read data RDATA<0:N> according to the second impedance calibration code PDCODE<0:N>. The plurality of main pull-up drivers 401 may drive the data input/output section 13 with an impedance determined according to the pull-up control signal PU<0:M>. The plurality of main pull-down drivers 402 may drive the data input/output section 13 with an impedance determined according to the pull-down control signal PD<0:M>.

Figure 3:
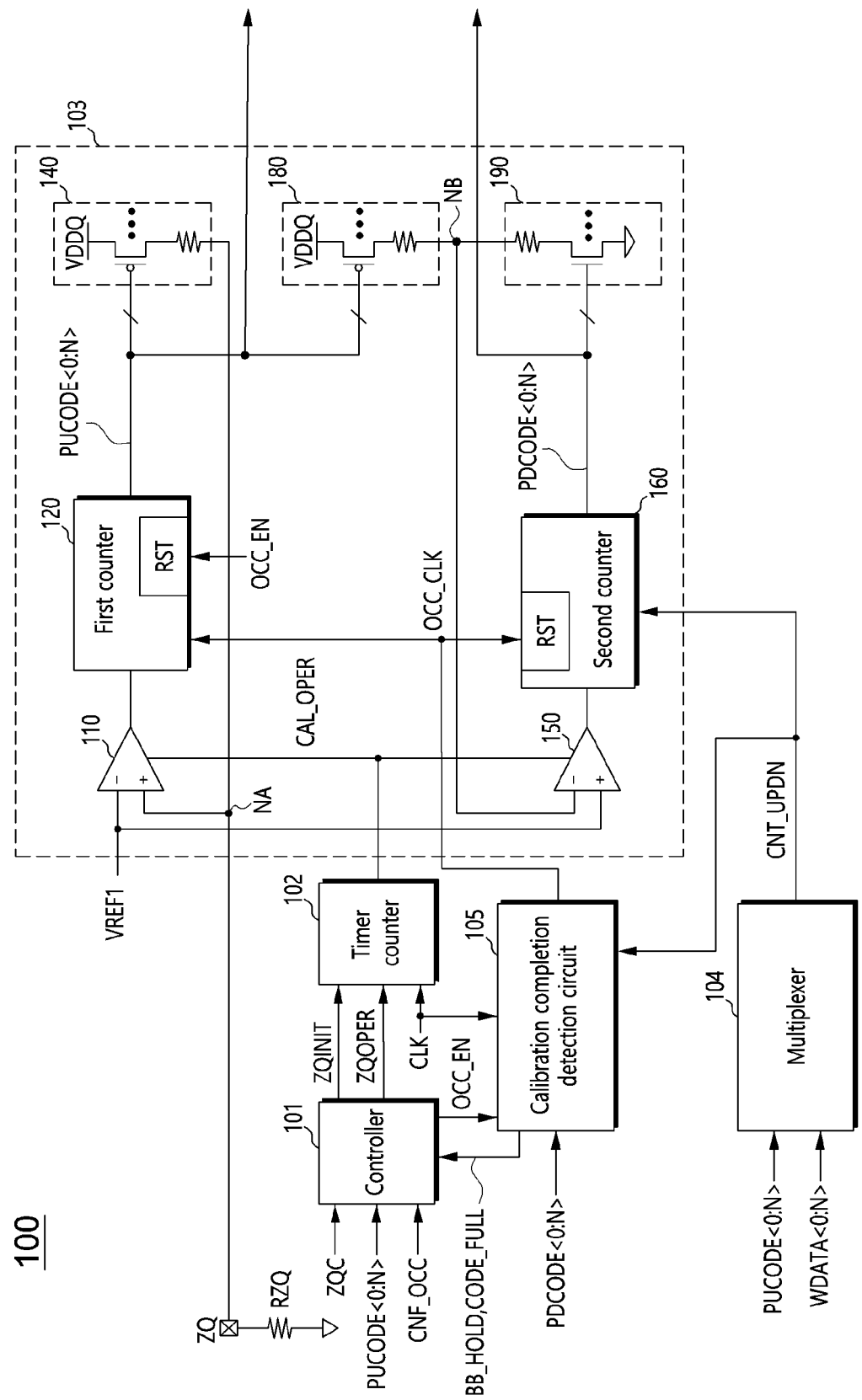
FIG. 3 is a diagram illustrating a configuration of an impedance calibration circuit of FIG. 2.

FIG. 3 is a diagram illustrating a configuration of the impedance calibration circuit 100 of FIG. 2.

Referring to FIG. 3, the impedance calibration circuit 100 may include a controller 101, a timer counter 102, an impedance calibration code generator 103, a multiplexer 104, and a calibration completion detection circuit 105.

The controller 101 may generate a plurality of internal commands ZQINIT and ZQOPER, which define the performance of the impedance calibration operation, in response to the impedance calibration command ZQC. According to the operation standard of the semiconductor apparatus 10, the impedance calibration command ZQC may be generated by a combination of CS(Chip Select)/, RAS(Row Access Strobe)/, CAS(Column Access Strobe)/, and WE(Write Enable)/. The controller 101 may generate the offset correction enable signal OCC_EN in response to the impedance calibration command ZQC, the mode register setting information CNF_OCC, the first impedance calibration code PUCODE<0:N>, a first code status signal BB_HOLD, and a second code status signal CODE_FULL. For example, when the mode register setting information CNF_OCC is set to a high level, the controller 101 may cause the impedance calibration circuit 100 to sequentially perform the offset correction operation and the impedance calibration operation according to the impedance calibration command ZQC. When the mode register setting information CNF_OCC is set to a low level, the controller 101 may maintain the offset correction enable signal OCC_EN in a deactivated state, and thereby, may cause the impedance calibration circuit 100 to perform only the impedance calibration operation according to the impedance calibration command ZQC.

The timer counter 102 may generate an operation control signal CAL_OPER for setting an impedance calibration operation time corresponding to each of the plurality of internal commands ZQINIT and ZQOPER, by using a clock signal CLK.

The impedance calibration code generator 103 may generate the first impedance calibration code PUCODE<0:N> and the second impedance calibration code PDCODE<0:N> by performing the impedance calibration operation according to the operation control signal CAL_OPER. The impedance calibration code generator 103 may generate the first impedance calibration code PUCODE<0:N> and the second impedance calibration code PDCODE<0:N> by performing the offset correction operation according to the offset correction enable signal OCC_EN, a change timing signal OCC_CLK, and a counting control signal CNT_UPDN. The change timing signal OCC_CLK may be used as a signal for changing a buffer unit to perform the offset correction operation among the plurality of buffer units RX of the data input buffer 200 of FIG. 2.

The impedance calibration code generator 103 may include a first comparator 110, a first counter 120, a first digital/analog converter 140, a second comparator 150, a second counter 160, a second digital/analog converter 180, and a third digital/analog converter 190.

The first comparator 110 may compare a first reference voltage VREF1 and a voltage of a first node NA during an activation period of the operation control signal CAL_OPER according to the impedance calibration command ZQC, and thereby, may output a comparison result. The first node NA may be coupled to an external resistor RZQ through an external resistor pad ZQ.

The first counter 120 may calibrate a value of the first impedance calibration code PUCODE<0:N> by performing up/down counting according to an output of the first comparator 110. The first counter 120 may calibrate a value of the first impedance calibration code PUCODE<0:N> according to the change timing signal OCC_CLK. The first counter 120 may initialize a value of the first impedance calibration code PUCODE<0:N> according to the offset correction enable signal OCC_EN.

The first digital/analog converter 140 may convert the first impedance calibration code PUCODE<0:N> into an analog voltage level and apply the analog voltage level to the first node NA. The first digital/analog converter 140 may include a plurality of PMOS transistors and a resistor. The plurality of PMOS transistors may be coupled between a terminal of a power supply voltage VDDQ and one end of the resistor. The other end of the resistor may be coupled to the external resistor pad ZQ. The first digital/analog converter 140 may have a circuit configuration which is obtained by duplicating the plurality of main pull-up drivers 401 of the data output buffer 300. The first digital/analog converter 140 may be coupled to the external resistor RZQ through the external resistor pad ZQ.

The second comparator 150 may compare the first reference voltage VREF1 and a voltage of a second node NB during an activation period of the operation control signal CAL_OPER according to the impedance calibration command ZQC, and thereby, may output a comparison result.

The second counter 160 may calibrate a value of the second impedance calibration code PDCODE<0:N> by performing up/down counting according to an output of the second comparator 150. The second counter 160 may calibrate a value of the second impedance calibration code PDCODE<0:N> according to the counting control signal CNT_UPDN. The second counter 160 may initialize a value of the second impedance calibration code PDCODE<0:N> according to the change timing signal OCC_CLK.

The second digital/analog converter 180 may convert the first impedance calibration code PUCODE<0:N> into an analog voltage level and apply the analog voltage level to the second node NB. The second digital/analog converter 180 may include a plurality of PMOS transistors and a resistor. The plurality of PMOS transistors may be coupled between a terminal of the power supply voltage VDDQ and one end of the resistor. The other end of the resistor may be coupled to the second node NB. The second digital/analog converter 180 may have a circuit configuration which is obtained by duplicating the plurality of main pull-up drivers 401 of the data output buffer 300.

The third digital/analog converter 190 may convert the second impedance calibration code PDCODE<0:N> into an analog voltage level and apply the analog voltage level to the second node NB. The third digital/analog converter 190 may include a plurality of NMOS transistors and a resistor. The plurality of NMOS transistors may be coupled between a terminal of a ground terminal and one end of the resistor. The other end of the resistor may be coupled to the second node NB. The third digital/analog converter 190 may have a circuit configuration which is obtained by duplicating the plurality of main pull-down drivers 402 of the data output buffer 300.

The multiplexer 104 may select one of the write data WDATA<0:N> according to the first impedance calibration code PUCODE<0:N> and output the selected one of the write data WDATA<0:N> as the counting control signal CNT_UPDN.

The calibration completion detection circuit 105 may generate the first code status signal BB_HOLD, the second code status signal CODE_FULL, and the change timing signal OCC_CLK according to the counting control signal CNT_UPDN and the second impedance calibration code PDCODE<0:N>. The calibration completion detection circuit 105 may generate the first code status signal BB_HOLD according to the counting control signal CNT_UPDN. The calibration completion detection circuit 105 may generate the second code status signal CODE_FULL according to the second impedance calibration code PDCODE<0:N>. The calibration completion detection circuit 105 may generate the change timing signal OCC_CLK by combining the first code status signal BB_HOLD and the second code status signal CODE_FULL. The first code status signal BB_HOLD may be activated (for example, to a high level) as it is detected that a value of the counting control signal CNT_UPDN repeats '0' (a logic low level) and '1' (a logic high level) at least a preset number of times as an offset corrected by the offset correction operation approaches '0' within an error margin. The second code status signal CODE_FULL may be activated as it is detected that a value of the second impedance calibration code PDCODE<0:N> has reached a limit value. The fact that a value of the second impedance calibration code PDCODE<0:N> has reached a limit value may mean a case where a value of the second impedance calibration code PDCODE<0:N> becomes a maximum value and is thus impossible to further increase and a case where a value of the second impedance calibration code PDCODE<0:N> becomes a minimum value and is thus impossible to further decrease.

Figure 4:
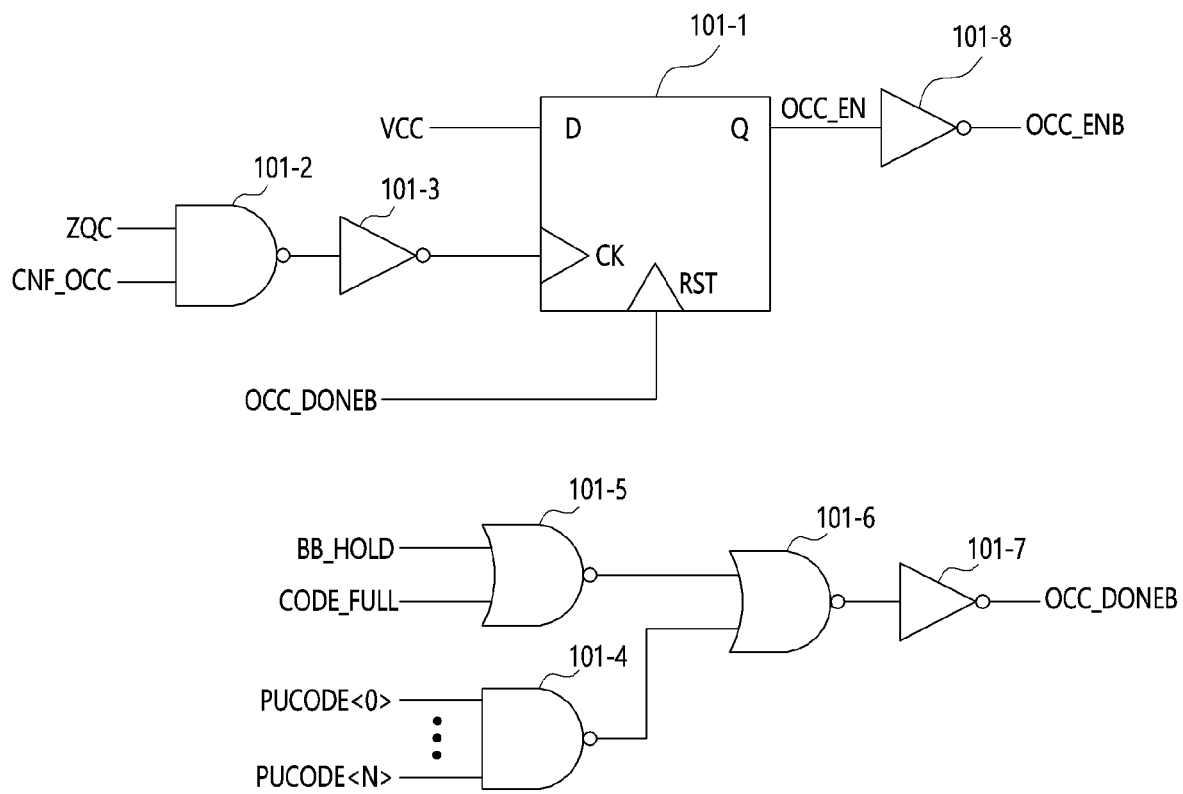
FIG. 4 is a diagram illustrating a configuration of a controller of FIG. 3.

FIG. 4 is a diagram illustrating a configuration of the controller 101 of FIG. 3.

Referring to FIG. 4, the controller 101 may include a flip-flop 101-1 and first to seventh logic gates 101-2 to 101-8.

The flip-flop 101-1 may receive a power supply voltage VCC through an input terminal D, may receive an offset correction completion signal OCC_DONEB through a reset terminal RST, and may output the offset correction enable signal OCC_EN through an output terminal Q according to an input to a clock terminal CK. The flip-flop 101-1 may output a level of the power supply voltage VCC as the offset correction enable signal OCC_EN according to a rising edge of a signal inputted through the clock terminal CK. The flip-flop 101-1 may initialize a value of the offset correction enable signal OCC_EN according to the offset correction completion signal OCC_DONEB. The first and second logic gates 101-2 and 101-3 may perform a logical AND operation on the impedance calibration command ZQC and the mode register setting information CNF_OCC, and thereby, may input an input to the clock terminal CK of the flip-flop 101-1. The third logic gate 101-4 may output a result of performing a logical NAND operation on respective bits of the second impedance calibration code PDCODE<0:N>. The third logic gate 101-4 may output a low level signal when all the bits of the second impedance calibration code PDCODE<0:N> are '1,' that is, when a last buffer unit to perform an offset correction is selected among the plurality of buffer units RX of the data input buffer 200. The fourth logic gate 101-5 may output a result of performing a logical NOR operation on the first code status signal BB_HOLD and the second code status signal CODE_FULL. The fourth logic gate 101-5 may output a low level signal when even any one of the first code status signal BB_HOLD and the second code status signal CODE_FULL has a high level, that is, when the offset correction for a corresponding buffer unit is completed. The fifth and sixth logic gates 101-6 and 101-7 may output a result of performing a logical OR operation on an output of the third logic gate 101-4 and an output of the fourth logic gate 101-5, as the offset correction completion signal OCC_DONEB. The fifth and sixth logic gates 101-6 and 101-7 may output the offset correction completion signal OCC_DONEB having a low level when the offset correction operation for all of the plurality of buffer units RX of the data input buffer 200 is completed. The seventh logic gate 101-8 may invert the offset correction enable signal OCC_EN and thereby generate an inverted offset correction enable signal OCC_ENB.

Figure 5:
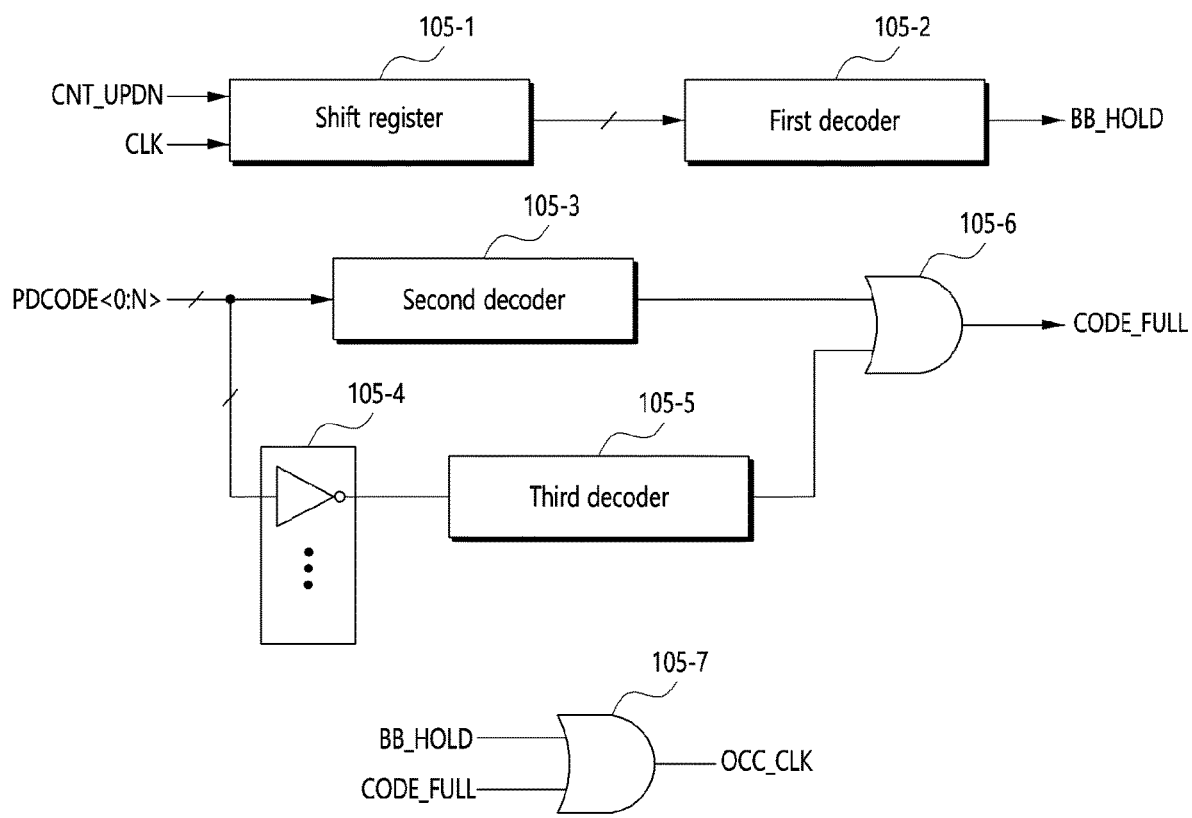
FIG. 5 is a diagram illustrating a configuration of a calibration completion detection circuit of FIG. 3.

FIG. 5 is a diagram illustrating a configuration of the calibration completion detection circuit 105 of FIG. 3.

Referring to FIG. 5, the calibration completion detection circuit 105 may include a shift register 105-1, a first decoder 105-2, a second decoder 105-3, an inverter array 105-4, a third decoder 105-5, a first logic gate 105-6, and a second logic gate 105-7.

The shift register 105-1 may output a signal having a plurality of bits, by shifting the counting control signal CNT_UPDN according to the clock signal CLK. For example, the shift register 105-1 may be designed to output a signal of 2*N bits so as to detect that the counting control signal CNT_UPDN repeats '01' N times and repeats '10' N times. The fact that the output signal of the shift register 105-1 repeats '01' N times and repeats '10' N times may mean that an offset corrected by the offset correction operation approaches '0' within an error margin.

The first decoder 105-2 may generate the first code status signal BB_HOLD by decoding the output signal of the shift register 105-1. For example, when the shift register 105-1 is designed to output a signal of 4 bits, the first decoder 105-2 may output the first code status signal BB_HOLD at a high level when the output signal of the shift register 105-1 is '0101' and when the output signal of the shift register 105-1 is '1010.'

The second decoder 105-3 may decode the second impedance calibration code PDCODE<0:N> and output an output. The second decoder 105-3 may detect a maximum value of the second impedance calibration code PDCODE<0:N>. The second decoder 105-3 may output a high level signal when a value of the second impedance calibration code PDCODE<0:N> is the maximum value, that is, all bits are '1.'

The inverter array 105-4 may invert the second impedance calibration code PDCODE<0:N> and output an output.

The third decoder 105-5 may decode the output of the inverter array 105-4 and output an output. The third decoder 105-5 may detect a minimum value of the second impedance calibration code PDCODE<0:N>. The third decoder 105-5 may output a high level signal when a value of the second impedance calibration code PDCODE<0:N> is the minimum value, that is, all bits are '0.'

The first logic gate 105-6 may perform a logical OR operation on the output of the second decoder 105-3 and the output of the third decoder 105-5 and output the result as the second code status signal CODE_FULL.

The second logic gate 105-7 may output a result of performing a logical OR operation on the first code status signal BB_HOLD and the second code status signal CODE_FULL as the change timing signal OCC_CLK.

Figure 6:
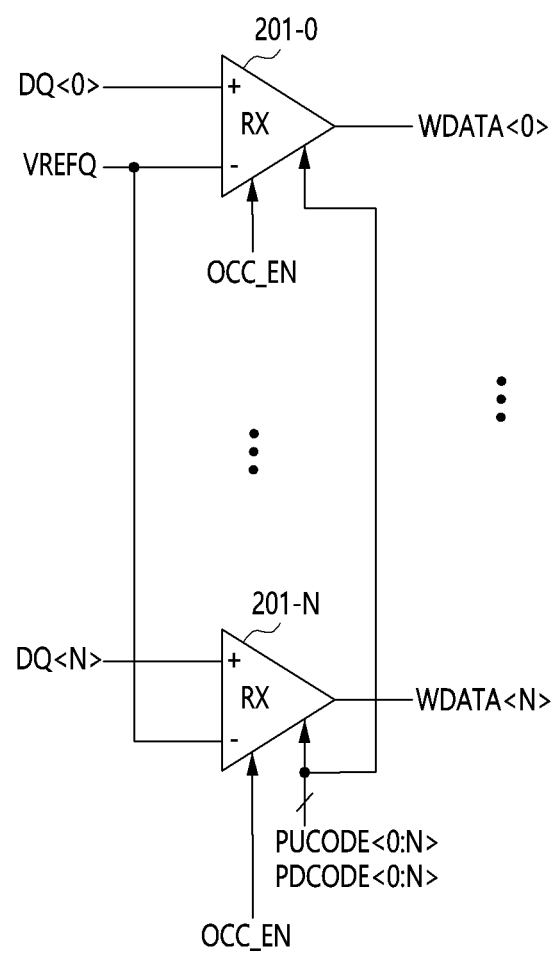
FIG. 6 is a diagram illustrating a configuration of a data input buffer of FIG. 2.

FIG. 6 is a diagram illustrating a configuration of the data input buffer 200 of FIG. 2.

Referring to FIG. 6, the data input buffer 200 may include a plurality of buffer units 201-0 to 201-N.

The plurality of buffer units 201-0 to 201-N may generate the write data WDATA<0:N> by comparing voltage levels of a plurality of data input/output pads DQ<0:N> corresponding thereto, respectively, with a reference voltage VREFQ. For example, a first buffer unit 201-0 may generate the write data WDATA<0> by comparing a voltage level of the data input/output pad DQ<0> with the reference voltage VREFQ. The plurality of buffer units 201-0 to 201-N may receive in common the offset correction enable signal OCC_EN, the first impedance calibration code PUCODE<0:N>, and the second impedance calibration code PDCODE<0:N>. The plurality of buffer units 201-0 to 201-N may detect offsets between first input terminals (+) and second input terminals (−) in response to the offset correction enable signal OCC_EN, and may output detected offset information as the write data WDATA<0:N>. The plurality of buffer units 201-0 to 201-N may correct offsets according to the first impedance calibration code PUCODE<0:N> and the second impedance calibration code PDCODE<0:N>.

Figure 7:
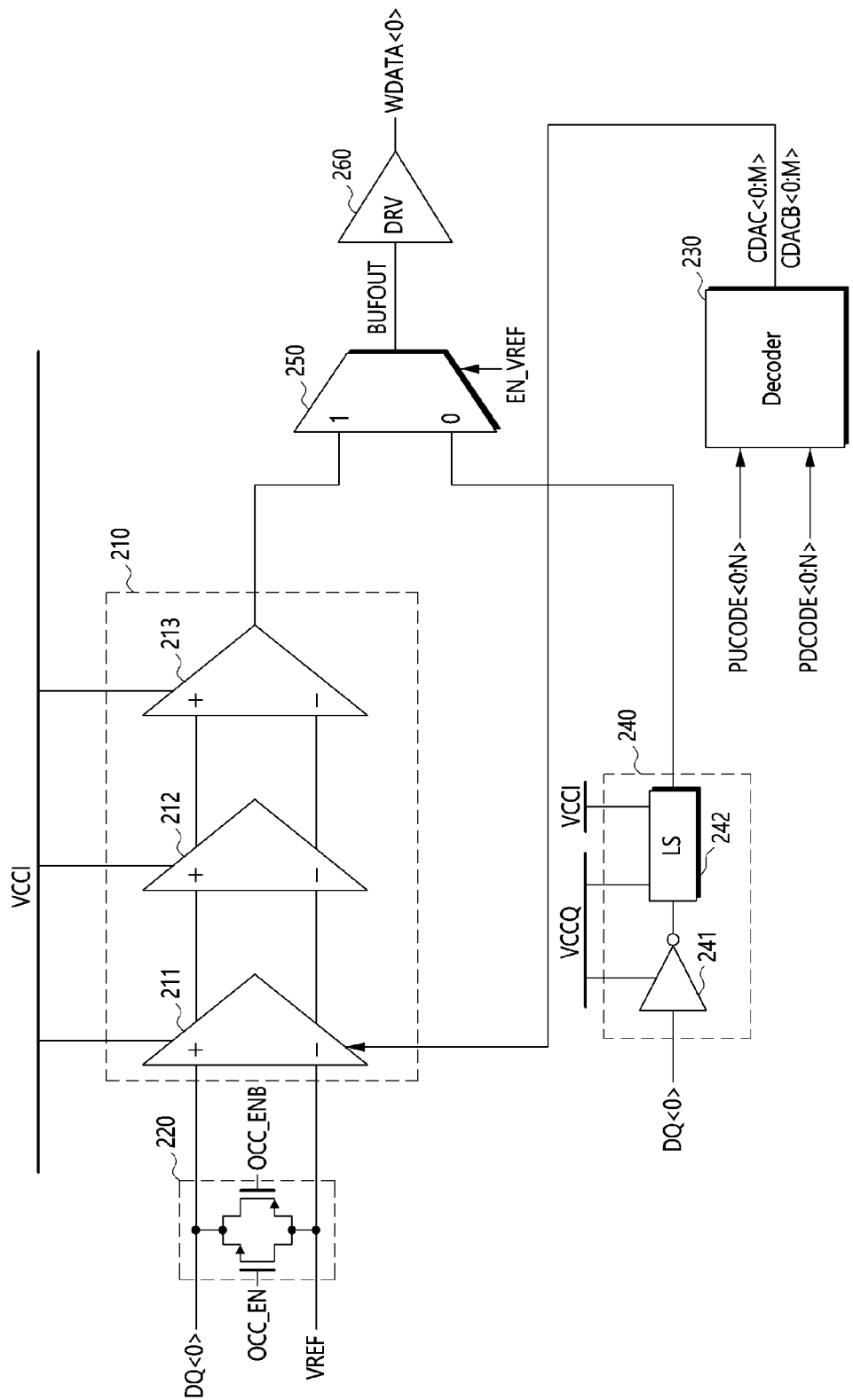
FIG. 7 is a diagram illustrating a configuration of a buffer unit of FIG. 6.

FIG. 7 is a diagram illustrating a configuration of the buffer unit 201-0 of FIG. 6.

Referring to FIG. 7, the buffer unit 201-0 may include a first receiver 210, a coupler 220, a decoder 230, a second receiver 240, a multiplexer 250, and a driver 260.

The first receiver 210 may amplify a difference between a voltage level of data inputted through the data input/output pad DQ<0> and the reference voltage VREF and output an output. The first receiver 210 may be corrected in its offset according to offset correction codes CDAC<0:M> and CDACB<0:M>. The first receiver 210 may include one or more amplifier circuits, for example, a first amplifier circuit 211, a second amplifier circuit 212, and a third amplifier circuit 213. The offset correction codes CDAC<0:M> and CDACB<0:M> may be inputted to at least one of the first amplifier circuit 211, the second amplifier circuit 212, and the third amplifier circuit 213, for example, the first amplifier circuit 211. The offset of the first receiver 210 may be corrected by calibrating a load resistance value of the first amplifier circuit 211 according to the offset correction codes CDAC<0:M> and CDACB<0:M>. The first receiver 210 may be used when an operation mode of the semiconductor apparatus 10 is a high-speed mode.

The coupler 220 may short-circuit a first input terminal (+) and a second input terminal (−) of the first amplifier circuit 211 according to the offset correction enable signal OCC_EN and the inverted offset correction enable signal OCC_ENB. The coupler 220 may include a transmission gate which is configured to short-circuit the first input terminal (+) and the second input terminal (−) according to the offset correction enable signal OCC_EN and the inverted offset correction enable signal OCC_ENB. As the coupler 220 short-circuits the first input terminal (+) and the second input terminal (−) of the first amplifier circuit 211, the third amplifier circuit 213 may output a signal having a logic level corresponding to an offset of the buffer unit 201-0.

The decoder 230 may latch the second impedance calibration code PDCODE<0:N> according to the first impedance calibration code PUCODE<0:N>, may decode a latched code, and thereby, may generate the offset correction codes CDAC<0:M> and CDACB<0:M>. The decoder 230 may latch the second impedance calibration code PDCODE<0:N> when the first impedance calibration code PUCODE<0:N> has a value corresponding thereto, for example, '000,' may decode a latched code, and thereby, may generate the offset correction codes CDAC<0:M> and CDACB<0:M>.

The second receiver 240, as a component for a relatively low speed operation compared to the first receiver 210, may be used when an operation mode of the semiconductor apparatus 10 is a low-speed mode operating with a relatively slow operating frequency compared to the high-speed mode. The second receiver 240 may include an inverter chain 241 and a level shifter 242. The level shifter 242 may convert a signal having a level of an external power supply voltage VCCQ, which is outputted through the inverter chain 241, into a level of an internal power supply voltage VCCI and output an output.

The multiplexer 250 may generate an output signal BUFOUT by selecting one of the output of the first receiver 210 and the output of the second receiver 240 according to a multiplexing control signal EN_VREF. The multiplexing control signal EN_VREF may have a different value (a high level/a low level) depending on the setting of an operation mode (a high-speed mode/a low-speed mode) of the semiconductor apparatus 10. The multiplexer 250 may select and output the output of the first receiver 210 when the multiplexing control signal EN_VREF has a high level, and may select and output the output of the second receiver 240 when the multiplexing control signal EN_VREF has a low level.

The driver 260 may generate the write data WDATA<0> by driving the output signal BUFOUT of the multiplexer 250.

Figure 8:
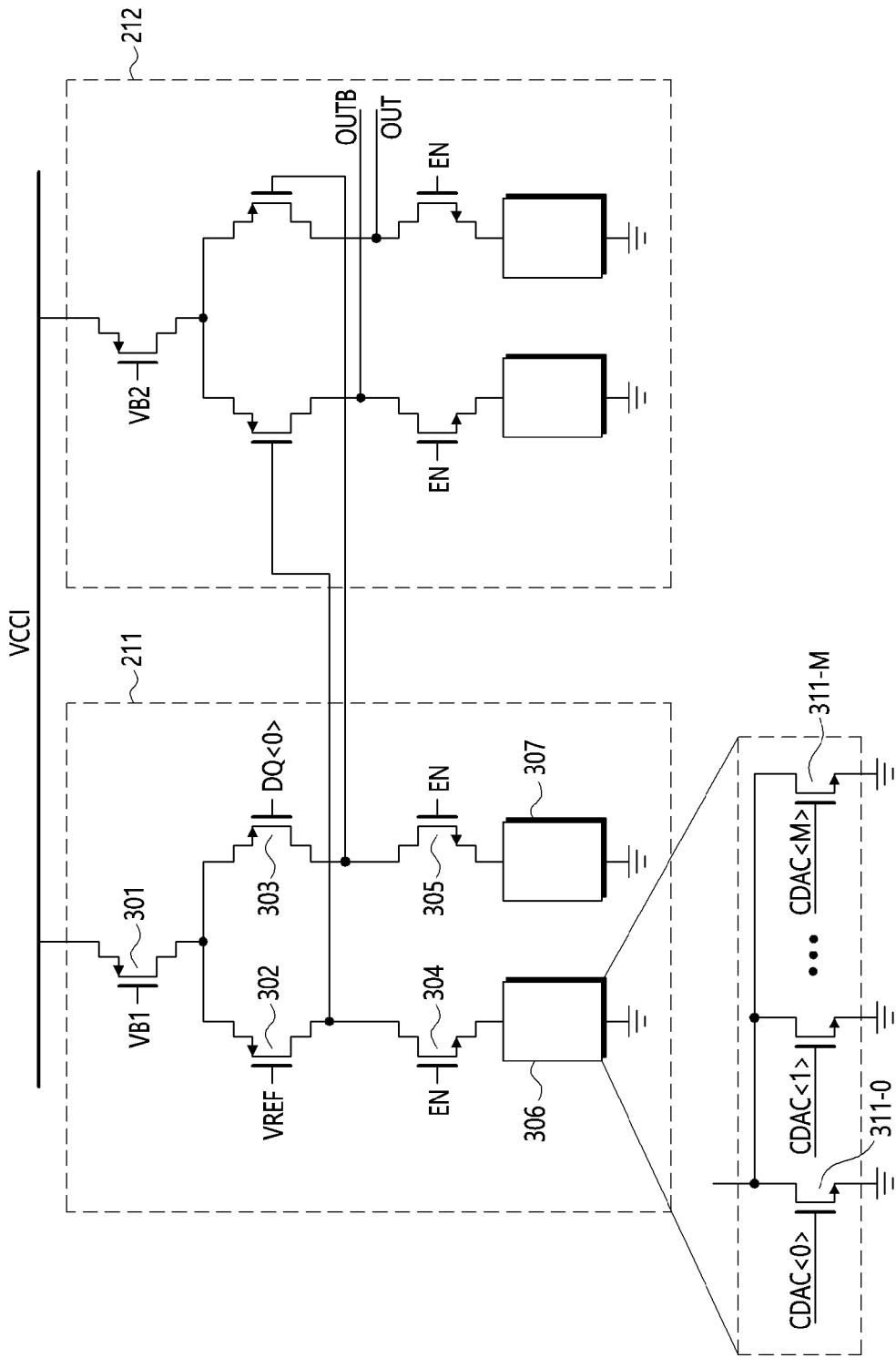
FIG. 8 is a diagram illustrating circuit configurations of a first amplifier circuit and a second amplifier circuit of FIG. 7.

FIG. 8 is a diagram illustrating circuit configurations of the first amplifier circuit 211 and the second amplifier circuit 212 of FIG. 7.

Referring to FIG. 8, the first amplifier circuit 211 may include a plurality of transistors 301 to 305 and a plurality of variable loads 306 and 307.

A first transistor 301 may operate as a current source which calibrates a current amount according to the internal power supply voltage VCCI in response to a first bias voltage VB1. The internal power supply voltage VCCI may be applied to a source terminal of the first transistor 301, and the first bias voltage VB1 may be inputted to a gate terminal of the first transistor 301. A source terminal of a second transistor 302 and a source terminal of a third transistor 303 may be coupled to a drain terminal of the first transistor 301. A differential pair may be configured by the second transistor 302 and the third transistor 303. The reference voltage VREF may be inputted to a gate terminal of the second transistor 302, and a first output signal may be generated through a drain terminal of the second transistor 302. The data input/output pad DQ<0> may be coupled to a gate terminal of the third transistor 303, and a second output signal complementary to the first output signal may be generated through a drain terminal of the third transistor 303. The drain terminal of the second transistor 302 may be coupled to a drain terminal of a fourth transistor 304, and an enable signal EN may be inputted to a gate terminal of the fourth transistor 304. One end of a first variable load 306 may be coupled to a source terminal of the fourth transistor 304, and the other end of the first variable load 306 may be coupled to a ground terminal. The first variable load 306 may include a plurality of transistors 311-0 to 311-M. The plurality of transistors 311-0 to 311-M may have source terminals which are coupled in common to the source terminal of the fourth transistor 304, drain terminals which are coupled to ground terminals, and gate terminals to which bits of the offset correction code CDAC<0:M> are inputted, respectively. A resistance value of the first variable load 306 may be calibrated according to the offset correction code CDAC<0:M>. The drain terminal of the third transistor 303 may be coupled to a drain terminal of a fifth transistor 305, and the enable signal EN may be inputted to a gate terminal of the fifth transistor 305. One end of a second variable load 307 may be coupled to a source terminal of the fifth transistor 305, and the other end of the second variable load 307 may be coupled to a ground terminal. The second variable load 307 may be configured in the same manner as the first variable load 306, and a resistance value of the second variable load 307 may be calibrated according to the offset correction code CDACB<0:M>. The first amplifier circuit 211 may amplify data inputted through the data input/output pad DQ<0> according to the reference voltage VREF during an activation period (e.g., a high level period) of the enable signal EN, and thereby, may output an output. The first amplifier circuit 211 may remove an offset of the data input buffer 200 by calibrating resistance values of the first variable load 306 and the second variable load 307 according to the offset correction codes CDAC<0:M> and CDACB<0:M>.

The second amplifier circuit 212 may generate a differential output signal OUT/OUTB by amplifying a difference between the first output signal and the second output signal of the first amplifier circuit 211. The second amplifier circuit 212 may be configured in the same manner as the first amplifier circuit 211. A first variable load and a second variable load of the second amplifier circuit 212 may be set in their resistance values according to not the offset correction codes CDAC<0:M> and CDACB<0:M> but separate codes. The codes applied to the first variable load and the second variable load may be set by a mode register set or the like.

Figure 9:
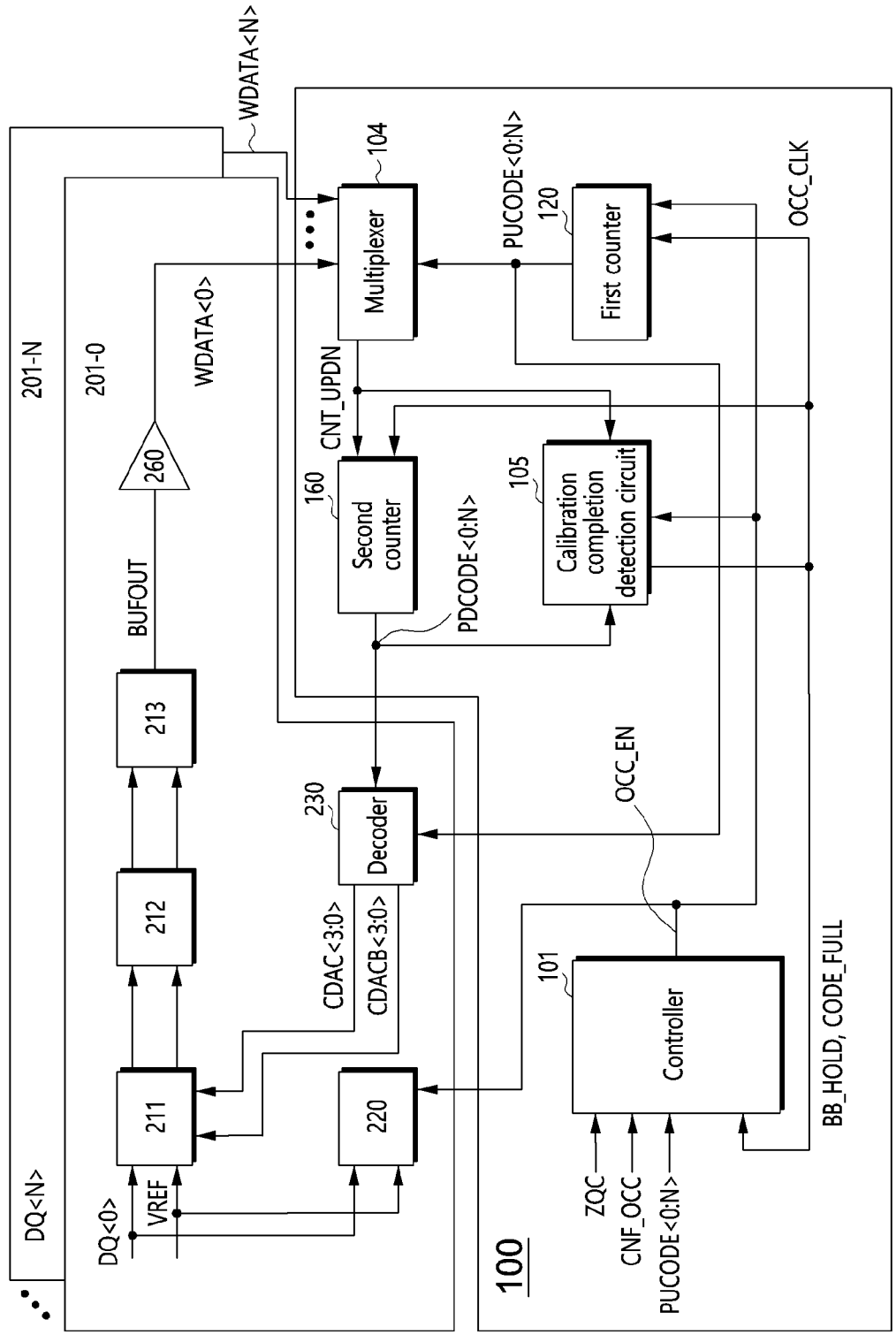
FIG. 9 is a diagram schematically illustrating configurations of the impedance calibration circuit and the data input buffer in accordance with the embodiment.

FIG. 9 is a diagram schematically illustrating configurations of the impedance calibration circuit 100 and the data input buffer 200 in accordance with the embodiment.

The offset correction operation of the data input buffer 200 in accordance with the embodiment will be described below with reference to FIG. 9.

In the impedance calibration operation in accordance with the embodiment, the first impedance calibration code PUCODE<0:N> and the second impedance calibration code PDCODE<0:N> may be used for the output impedance calibration of the data output buffer 300. In the offset correction operation in accordance with the embodiment, the first impedance calibration code PUCODE<0:N> may be used to sequentially select the buffer units 201-0 to 201-N of the data input buffer 200, and the second impedance calibration code PDCODE<0:N> may be used for the offset correction of each of the buffer units 201-0 to 201-N.

As the impedance calibration command ZQC and the mode register setting information CNF_OCC are inputted at high levels, the controller 101 outputs the offset correction enable signal OCC_EN at a high level.

As the offset correction enable signal OCC_EN is outputted at a high level, the coupler 220 of each of the buffer units 201-0 to 201-N may short-circuit the first input terminal (+) and the second input terminal (−) of the first amplifier circuit 211, and the third amplifier circuit 213 may output a logic level corresponding to an offset of each of the buffer units 201-0 to 201-N as each of the write data WDATA<0:N>.

As the offset correction enable signal OCC_EN is outputted at a high level, the first counter 120 may initialize the first impedance calibration code PUCODE<0:N>, and the multiplexer 104 may output the write data WDATA<0> among the write data WDATA<0:N> as the counting control signal CNT_UPDN according to the initialized first impedance calibration code PUCODE<0:N>, by which the offset correction operation for any one, for example, the buffer unit 201-0, among the buffer units 201-0 to 201-N may be started.

The second counter 160 may increase or decrease a value of the second impedance calibration code PDCODE<0:N> according to the counting control signal CNT_UPDN. The second counter 160 may increase a value of the second impedance calibration code PDCODE<0:N> when the counting control signal CNT_UPDN has a high level, and may decrease a value of the second impedance calibration code PDCODE<0:N> when the counting control signal CNT_UPDN has a low level.

The decoder 230 of the buffer unit 201-0, corresponding to a value of the initialized first impedance calibration code PUCODE<0:N>, among the buffer units 201-0 to 201-N may calibrate values of the offset correction codes CDAC<0:M> and CDACB<0:M> by latching and decoding the second impedance calibration code PDCODE<0:N>. The resistance value of the first amplifier circuit 211 may be calibrated according to the offset correction codes CDAC<0:M> and CDACB<0:M>.

When an offset of the buffer unit 201-0 is corrected within an error margin by repeating the operation of calibrating a resistance value of the first amplifier circuit 211 by calibrating values of the offset correction codes CDAC<0:M> and CDACB<0:M>, a value of a least significant bit of the second impedance calibration code PDCODE<0:N> repeats '0' and '1.' When the calibration completion detection circuit 105 detects that a value of the least significant bit of the second impedance calibration code PDCODE<0:N> repeats '0' and '1' a preset number of times and thereby outputs the first code status signal BB_HOLD at a high level, the offset correction operation for the buffer unit 201-0 may be completed. Further, as the calibration completion detection circuit 105 outputs the second code status signal CODE_FULL at a high level when a value of the second impedance calibration code PDCODE<0:N> becomes a maximum value or a minimum value, the offset correction operation for the buffer unit 201-0 may be completed. The calibration completion detection circuit 105 may generate the change timing signal OCC_CLK at a high level when any even one of the first code status signal BB_HOLD and the second code status signal CODE_FULL is a high level.

As the change timing signal OCC_CLK becomes a high level, the first counter 120 may increase a value of the first impedance calibration code PUCODE<0:N>. As a value of the first impedance calibration code PUCODE<0:N> is increased, the multiplexer 104 may output the write data WDATA<1> among the write data WDATA<0:N> as the counting control signal CNT_UPDN, and thereby, the offset correction operation for the buffer unit 201-1 of next order may be started. As the first code status signal BB_HOLD or the second code status signal CODE_FULL becomes a high level, the offset correction operation for the buffer unit 201-1 may be completed.

By increasing a value of the first impedance calibration code PUCODE<0:N> each time the change timing signal OCC_CLK is generated at a high level, the offset correction operations for the remaining buffer units 201-2 to 201-N may be sequentially performed. When the offset correction operation for the last buffer unit 201-N is completed, a value of the first impedance calibration code PUCODE<0:N> is the maximum value and one of the first code status signal BB_HOLD and the second code status signal CODE_FULL is a high level. Thus, the controller 101 may complete the offset correction operations for all the buffer units 201-0 to 201-N by generating the offset correction enable signal OCC_EN to a low level.

While various embodiments have been described above, it will be understood by those skilled in the art that the embodiments described are examples only. Accordingly, the data input buffer and the semiconductor apparatus including the same described herein should not be limited based on the described embodiments.

What is claimed is:

1. A data input buffer comprising:
a plurality of buffer units configured to receive a first impedance calibration code and a second impedance calibration code,
wherein each of the plurality of buffer units outputs an offset detected with a first input terminal and a second input terminal thereof short-circuited, as write data, and
wherein a buffer unit corresponding to a current value of the first impedance calibration code among the plurality of buffer units is configured to correct the offset according to the second impedance calibration code.

2. The data input buffer according to claim 1, wherein each of the plurality of buffer units comprises:
a first receiver configured to output an output by amplifying a voltage level difference between the first input terminal and the second input terminal, and correct the offset according to an offset correction code;
a coupler configured to short-circuit the first input terminal and the second input terminal according to an offset correction enable signal; and
a decoder configured to latch the second impedance calibration code according to the first impedance calibration code, and generate the offset correction code by decoding a latched code.

3. The data input buffer according to claim 2, wherein
the first receiver comprises a first amplifier circuit and a second amplifier circuit, and
at least one of the first amplifier circuit and the second amplifier circuit is configured to correct the offset according to the offset correction code.

4. The data input buffer according to claim 2, wherein each of the plurality of buffer units further comprises:
a second receiver configured to operate at a relatively low speed compared to the first receiver; and
a multiplexer configured to generate an output signal by selecting one of an output of the first receiver and an output of the second receiver according to a multiplexing control signal.

5. A semiconductor apparatus comprising:
an impedance calibration circuit configured to receive as input write data, an impedance calibration command, and mode register setting information and perform an offset correction operation of calibrating a value of an impedance calibration code according to the write data in response to the impedance calibration command and the mode register setting information; and
a data input buffer configured to detect an offset, output detected offset information as the write data, and correct the offset according to the impedance calibration code.

6. The semiconductor apparatus according to claim 5, wherein the impedance calibration circuit is configured to perform an impedance calibration operation of calibrating a value of the impedance calibration code based on an impedance of an external resistor in response to the impedance calibration command.

7. The semiconductor apparatus according to claim 6, further comprising:
a data output buffer configured to drive read data with an output impedance calibrated according to the impedance calibration code to output the driven read data through a data input/output section.

8. The semiconductor apparatus according to claim 5, wherein the impedance calibration circuit comprises:
a controller configured to generate an offset correction enable signal in response to the impedance calibration command, the mode register setting information, a first impedance calibration code, a first code status signal, and a second code status signal;
a first counter configured to calibrate a value of the first impedance calibration code according to a change timing signal;
a second counter configured to calibrate a value of the second impedance calibration code according to a counting control signal;
a multiplexer configured to output the counting control signal by selecting one of the write data according to the first impedance calibration code; and
a calibration completion detection circuit configured to generate the first code status signal, the second code status signal, and the change timing signal according to the counting control signal and the second impedance calibration code.

9. The semiconductor apparatus according to claim 8, wherein the controller comprises:
a flip-flop configured to output the offset correction enable signal through an output terminal according to an input to a clock terminal, and initialize the output terminal according to an offset correction completion signal;
first and second logic gates configured to logically combine the impedance calibration command and the mode register setting information, and input an input to the clock terminal of the flip-flop;
a third logic gate configured to output a result of logically combining respective bits of the second impedance calibration code;
a fourth logic gate configured to output a result of logically combining the first code status signal and the second code status signal; and
fifth and sixth logic gates configured to output a result of logically combining an output of the third logic gate and an output of the fourth logic gate, as the offset correction completion signal.

10. The semiconductor apparatus according to claim 8, wherein the calibration completion detection circuit comprises:
a shift register configured to output a signal having a plurality of bits, by shifting the counting control signal according to a clock signal;
a first decoder configured to generate the first code status signal by decoding an output signal of the shift register;
a second decoder configured to output an output by decoding the second impedance calibration code;
an inverter array configured to output an output by inverting the second impedance calibration code;
a third decoder configured to output an output by decoding the output of the inverter array;
a first logic gate configured to output a result of logically combining the output of the second decoder and the output of the third decoder, as the second code status signal; and a second logic gate configured to output a result of logically combining the first code status signal and the second code status signal, as the change timing signal.

11. The semiconductor apparatus according to claim 6, wherein, when the mode register setting information is set to a first logic level, the controller controls the impedance calibration circuit according to the impedance calibration command so that the impedance calibration circuit sequentially performs the offset correction operation and the impedance calibration operation.

12. The semiconductor apparatus according to claim 9, wherein, when the mode register setting information is set to a second logic level, the controller controls the impedance calibration circuit according to the impedance calibration command so that the impedance calibration circuit performs only the impedance calibration operation.

13. The semiconductor apparatus according to claim 5, wherein the data input buffer comprises:
 a plurality of buffer units configured to receive the impedance calibration code including a first impedance calibration code and a second impedance calibration code,
 wherein each of the plurality of buffer units outputs an offset detected with a first input terminal and a second input terminal thereof short-circuited, as the write data, and wherein a buffer unit corresponding to a current value of the first impedance calibration code among the plurality of buffer units is configured to correct the offset according to the second impedance calibration code.

14. The semiconductor apparatus according to claim 13, wherein each of the plurality of buffer units comprises:
 a first receiver configured to output an output by amplifying a voltage level difference between the first input terminal and the second input terminal, and correct the offset according to an offset correction code;
 a coupler configured to short-circuit the first input terminal and the second input terminal according to an offset correction enable signal; and
 a decoder configured to latch the second impedance calibration code according to the first impedance calibration code, and generate the offset correction code by decoding a latched code.

15. A semiconductor apparatus comprising:
 a data input buffer including a plurality of buffer units which receive a first impedance calibration code and a second impedance calibration code, wherein each of the plurality of buffer units outputs an offset detected with a first input terminal and a second input terminal thereof short-circuited, as write data, and wherein a buffer unit corresponding to a current value of the first impedance calibration code among the plurality of buffer units is configured to correct the offset according to the second impedance calibration code;
 a data output buffer configured to drive read data with an output impedance calibrated according to the first impedance calibration code and the second impedance calibration code to output the driven read data through a data input/output section; and
 an impedance calibration circuit configured to perform an impedance calibration operation of calibrating a value of at least one of the first impedance calibration code and the second impedance calibration code to calibrate an output impedance of the data output buffer based on an impedance of an external resistor in response to an impedance calibration command, and perform an offset correction operation of calibrating a value of at least one of the first impedance calibration code and the second impedance calibration code to correct an offset of the data input buffer according to the write data in response to mode register setting information and the impedance calibration command.

16. The semiconductor apparatus according to claim 15, wherein the impedance calibration circuit is configured to sequentially perform, when the mode register setting information is set to a first logic level, the offset correction operation and the impedance calibration operation according to the impedance calibration command, and perform, when the mode register setting information is set to a second logic level, only the impedance calibration operation according to the impedance calibration command.

17. The semiconductor apparatus according to claim 15, wherein each of the plurality of buffer units comprises:
 a first receiver configured to output an output by amplifying a voltage level difference between the first input terminal and the second input terminal, and correct the offset according to an offset correction code;
 a coupler configured to short-circuit the first input terminal and the second input terminal according to an offset correction enable signal; and
 a decoder configured to latch the second impedance calibration code according to the first impedance calibration code, and generate the offset correction code by decoding a latched code.

18. The semiconductor apparatus according to claim 15, wherein the impedance calibration circuit comprises:
 a controller configured to generate the offset correction enable signal in response to the impedance calibration command, the mode register setting information, the first impedance calibration code, a first code status signal and a second code status signal;
 a first counter configured to calibrate a value of the first impedance calibration code according to a change timing signal;
 a second counter configured to calibrate a value of the second impedance calibration code according to a counting control signal;
 a multiplexer configured to output the counting control signal by selecting one of the write data according to the first impedance calibration code; and
 a calibration completion detection circuit configured to generate the first code status signal, the second code status signal and the change timing signal according to the counting control signal and the second impedance calibration code.

19. The semiconductor apparatus according to claim 18, wherein the controller comprises:
 a flip-flop configured to output the offset correction enable signal through an output terminal according to an input to a clock terminal, and initialize the output terminal according to an offset correction completion signal;
 first and second logic gates configured to logically combine the impedance calibration command and the mode register setting information, and input an output to the clock terminal of the flip-flop;
 a third logic gate configured to output a result of logically combining respective bits of the second impedance calibration code;
 a fourth logic gate configured to output a result of logically combining the first code status signal and the second code status signal; and
 fifth and sixth logic gates configured to output a result of logically combining an output of the third logic gate and an output of the fourth logic gate, as the offset correction completion signal.

20. The semiconductor apparatus according to claim 18, wherein the calibration completion detection circuit comprises:
- a shift register configured to output a signal having a plurality of bits, by shifting the counting control signal according to a clock signal;
- a first decoder configured to generate the first code status signal by decoding an output signal of the shift register;
- a second decoder configured to output an output by decoding the second impedance calibration code;
- an inverter array configured to output an output by inverting the second impedance calibration code;
- a third decoder configured to output an output by decoding the output of the inverter array;
- a first logic gate configured to output a result of logically combining the output of the second decoder and the output of the third decoder, as the second code status signal; and
- a second logic gate configured to output a result of logically combining the first code status signal and the second code status signal, as the change timing signal.

* * * * *